(12) United States Patent
Camacho (10) Patent No.: US 9,324,673 B2
(45) Date of Patent: Apr. 26, 2016

(54) INTEGRATED CIRCUIT PACKAGING SYSTEM WITH WAFER LEVEL RECONFIGURATION AND METHOD OF MANUFACTURE THEREOF

(75) Inventor: Zigmund Ramirez Camacho, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 693 days.

(21) Appl. No.: 13/167,649

(22) Filed: Jun. 23, 2011

(65) Prior Publication Data
US 2012/0326286 A1    Dec. 27, 2012

(51) Int. Cl.
| | | |
|---|---|---|
| *H01L 23/495* | (2006.01) | |
| *H01L 23/00* | (2006.01) | |
| *H01L 25/065* | (2006.01) | |
| *H01L 23/538* | (2006.01) | |
| *H01L 25/03* | (2006.01) | |
| *H01L 25/00* | (2006.01) | |
| *H01L 23/498* | (2006.01) | |
| *H01L 21/48* | (2006.01) | |

(52) U.S. Cl.
CPC .............. *H01L 24/24* (2013.01); *H01L 21/486* (2013.01); *H01L 23/49861* (2013.01); *H01L 23/5389* (2013.01); *H01L 24/19* (2013.01); *H01L 24/20* (2013.01); *H01L 25/03* (2013.01); *H01L 25/0657* (2013.01); *H01L 25/50* (2013.01); *H01L 21/4832* (2013.01); *H01L 23/49816* (2013.01); *H01L 23/49838* (2013.01); *H01L 2224/32145* (2013.01); *H01L 2224/73267* (2013.01); *H01L 2225/06558* (2013.01); *H01L 2924/014* (2013.01); *H01L 2924/01029* (2013.01)

(58) Field of Classification Search
CPC .................................................... H01L 25/0657
USPC .................................................... 257/676, 777
See application file for complete search history.

(56) References Cited

U.S. PATENT DOCUMENTS

| | | | |
|---|---|---|---|
| 6,582,992 B2 | 6/2003 | Poo et al. | |
| 6,982,487 B2 | 1/2006 | Kim et al. | |
| 7,208,344 B2 | 4/2007 | Ho | |
| 7,271,498 B2 * | 9/2007 | Huang | 257/781 |
| 7,378,602 B2 * | 5/2008 | Ikeda | 174/262 |
| 7,697,301 B2 * | 4/2010 | Lee et al. | 361/763 |
| 7,727,799 B2 * | 6/2010 | Lin | 438/106 |

(Continued)

OTHER PUBLICATIONS

U.S. Appl. No. 12/719,476, filed Mar. 8, 2010, Camacho et al.

(Continued)

*Primary Examiner* — Howard Weiss
(74) *Attorney, Agent, or Firm* — Ishimaru & Associates LLP (57) ABSTRACT

A method of manufacture of an integrated circuit packaging system includes: removing a portion of a leadframe to form a partially removed region and an upper portion of a peripheral lead on the leadframe first side; mounting a first integrated circuit over the partially removed region with a first adhesive; forming a first molding layer directly on the first integrated circuit and the peripheral lead; removing a portion of a leadframe second side exposing the first adhesive; mounting a second integrated circuit on the first adhesive of the first integrated circuit; forming a first interconnection layer directly on the first integrated circuit with the first integrated circuit and the peripheral lead electrically connected; and forming a second interconnection layer directly on the second integrated circuit with the second integrated circuit and the peripheral lead electrically connected.

20 Claims, 4 Drawing Sheets

(56) References Cited

U.S. PATENT DOCUMENTS

| | | |
|---|---|---|
| 7,807,512 B2 * | 10/2010 | Lee et al. .................. 438/127 |
| 8,241,956 B2 * | 8/2012 | Camacho et al. ........... 438/109 |
| 8,779,586 B2 * | 7/2014 | Oonishi et al. .............. 257/737 |
| 2004/0166662 A1 | 8/2004 | Lei |
| 2009/0014870 A1 | 1/2009 | Wu |

OTHER PUBLICATIONS

U.S. Appl. No. 12/853,865, filed Aug. 10, 2010, Shin et al.

* cited by examiner

INTEGRATED CIRCUIT PACKAGING SYSTEM WITH WAFER LEVEL RECONFIGURATION AND METHOD OF MANUFACTURE THEREOF

TECHNICAL FIELD

The present invention relates generally to an integrated circuit packaging system, and more particularly to a system for a wafer level packaging.

BACKGROUND ART

Modern electronics, such as smart phones, personal digital assistants, location based services devices, enterprise class servers, or enterprise class storage arrays, are packing more integrated circuits into an ever-shrinking physical space with expectations for decreasing cost. Numerous technologies have been developed to meet these requirements. Some of the research and development strategies focus on new technologies while others focus on improving the existing and mature technologies. Research and development in the existing technologies can take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. The demand still continues for lower cost, smaller size and more functionality.

Thus, a need still remains for an integrated circuit packaging system including lower cost, smaller size, increased connectivity, and more functionality. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: removing a portion of a leadframe to form a partially removed region and an upper portion of a peripheral lead on the leadframe first side; mounting a first integrated circuit over the partially removed region with a first adhesive; forming a first molding layer directly on the first integrated circuit and the peripheral lead; removing a portion of a leadframe second side exposing the first adhesive; mounting a second integrated circuit on the first adhesive of the first integrated circuit; forming a first interconnection layer directly on the first integrated circuit with the first integrated circuit and the peripheral lead electrically connected; and forming a second interconnection layer directly on the second integrated circuit with the second integrated circuit and the peripheral lead electrically connected.

The present invention provides an integrated circuit packaging system, including: a peripheral lead having a peripheral lead top surface, a peripheral lead center ridge, and a peripheral lead pad; a first interconnection layer directly on the peripheral lead top surface; a first integrated circuit directly on the first interconnection layer; a second integrated circuit on the first integrated circuit a first adhesive between the first integrated circuit and the second integrated circuit; a first molding layer directly on the peripheral lead and the first integrated circuit; and a second interconnection layer directly on the second integrated circuit.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
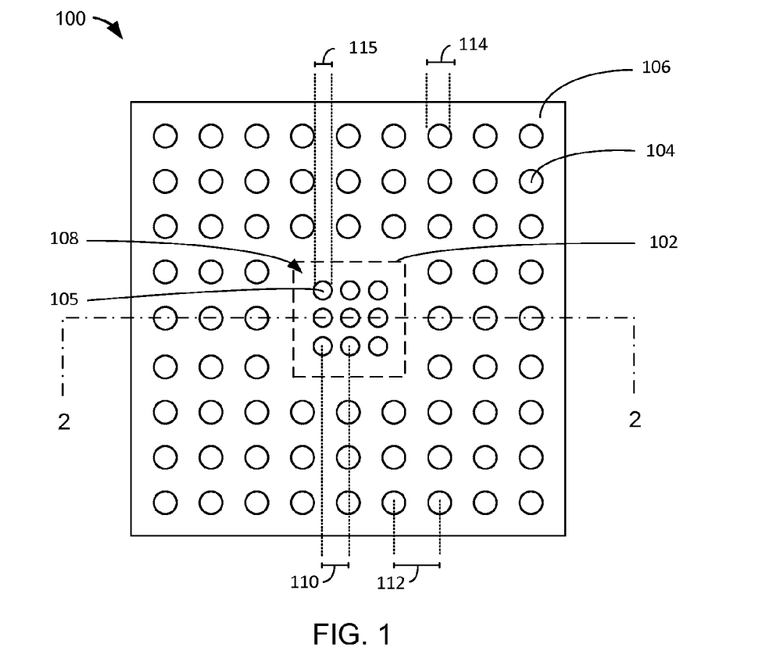
FIG. 1 is a top view of an integrated circuit packaging system in an embodiment of the present invention.

Referring now to FIG. 1, therein is shown a top view of an integrated circuit packaging system 100 in an embodiment of the present invention. The integrated circuit packaging system 100 can include a first integrated circuit 102, which is defined as an active electronic semiconductor component. The location of the first integrated circuit 102 is indicated by the dashed line rectangle in the center of FIG. 1. The first integrated circuit 102 is described in detail in a later section.

The integrated circuit packaging system 100 can include a first under bump metallization 104, which is defined as an electrically conductive element providing a surface for attaching an further conductor or interconnect and providing a protective barrier to other adjacent elements. The under bump metallization is described in detail in a later section.

For illustrative purposes, the first under bump metallization 104 is shown having a circular shape, although it is understood that the first under bump metallization 104 can include any shape. For example, the first under bump metallization 104 can include a circular shape, a rectangular shape, an oval shape, an irregular shape, a multi-sided shape, or a combination thereof.

The integrated circuit packaging system 100 can include a first interconnection layer 106, which is defined as a structure that provides electrical connectivity between a semiconductor device and a lead or connector. The first interconnection layer 106 is described in detail in a later section.

An array of a plurality of the first under bump metallization 104 can be distributed across the surface of the first interconnection layer 106. The array is defined as a physical arrangement or distribution of the plurality of the first under bump metallization 104 over a surface area of the first interconnection layer 106. The array can include the plurality of the first under bump metallization 104 that is fully populated, evenly spaced, or a combination thereof.

The array can be outside of a perimeter of the first integrated circuit 102. The array can also be within the perimeter of the first integrated circuit 102 such that an interior portion 108 of the first integrated circuit 102 can be directly under the array of the plurality of the first under bump metallization 104. The interior portion 108 is defined as a portion of the first integrated circuit 102 at the inside of the first integrated circuit 102 and away from a perimeter of the first integrated circuit 102.

The integrated circuit packaging system 100 can include the plurality of the first under bump metallization 104 having an external pitch 112, which is defined as the distance between two of the centers of the first under bump metallization 104 and an adjacent location with another of the first under bump metallization 104 where the first under bump metallization 104 is not directly over the first integrated circuit 102. The first under bump metallization 104 can have a first width 114.

The integrated circuit packaging system 100 can include a second under bump metallization 105, which is defined as an under bump metallization directly over the first integrated circuit 102. The integrated circuit packaging system 100 can include the plurality of the second under bump metallization 105 having an internal pitch 110, which is defined as the distance between the centers of two of the second under bump metallization 105 where the second under bump metallization 105 is over the first integrated circuit 102. The second under bump metallization 105 can have a second width 115.

It has been discovered that the first integrated circuit 102 having the interior portion 108 directly over an array of a plurality of the second under bump metallization 105 improves speed performance with less routing congestion due to an increase of routing area.

Figure 2:
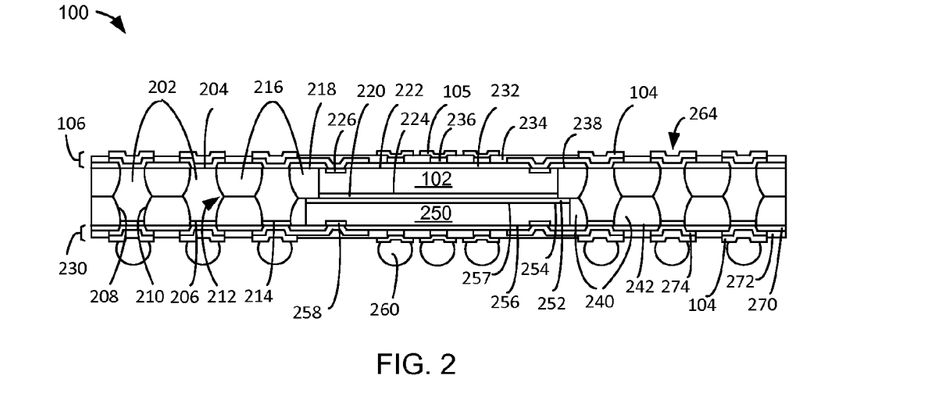
FIG. 2 is a cross-sectional view of the integrated circuit packaging system taken along line 2-2 of FIG. 1.

Referring now to FIG. 2, therein is shown a cross-sectional view of the integrated circuit packaging system 100 taken along line 2-2. The integrated circuit packaging system 100 can include a wafer scale package, quad flat no-lead (QFN) array, an Embedded Wafer Level BGA (eWLB), a wafer-level chip size/scale package (WSCSP), a multi-chip package, or a combination thereof.

The integrated circuit packaging system 100 can include a peripheral lead 202, which is defined as a conductive structure that provides connectivity for electrical signals or electrical potential levels. The integrated circuit packaging system 100 can include a plurality of the peripheral lead 202. For example, the peripheral lead 202 can represent an interconnection including a terminal, a bond pad, a lead, a wire, or any combination thereof The peripheral lead 202 can include a peripheral lead top surface 204 and a peripheral lead bottom surface 206 opposite the peripheral lead top surface 204. The peripheral lead top surface 204 and the peripheral lead bottom surface 206 are defined as top and bottom sides, respectively, of the peripheral lead 202.

The peripheral lead 202 can include a peripheral lead inner side 210 and a peripheral lead outer side 208. The peripheral lead inner side 210 is defined as a non-horizontal surface on the side closest to the center of the integrated circuit packaging system 100. The peripheral lead outer side 208 is defined as a non-horizontal surface on the side opposite the peripheral lead inner side 210. The peripheral lead outer side 208 is opposite the peripheral lead inner side 210.

The peripheral lead 202 can include a peripheral lead center ridge 212, which is defined as a portion of the peripheral lead 202 that extends outward from the peripheral lead inner side 210 and the peripheral lead outer side 208. The peripheral lead center ridge 212 can extend from the peripheral lead top surface 204 to the center of the peripheral lead 202. The peripheral lead center ridge 212 can extend from the peripheral lead bottom surface 206 to the center of the peripheral lead 202.

The peripheral lead 202 can include a peripheral lead pad 214, which is defined as an electrically conductive element providing protection of the underlying surface during etching and providing an electrical connection to the peripheral lead 202. The peripheral lead pad 214 can be formed on the peripheral lead bottom surface 206. The peripheral lead pad 214 can be directly on and under the peripheral lead 202.

The peripheral lead pad 214 can be formed from a variety of materials. For example, the peripheral lead pad 214 can be selectively formed from nickel (Ni), palladium (Pd), gold (Au), other metals, metal alloys, or a combination thereof The integrated circuit packaging system 100 can include a first molding layer 216, which is defined as a protective structure providing mechanical, electrical, and environmental protection. The first molding layer 216 can include a liquid epoxy molding, an encapsulant material, a spin-coating, an electrically insulating material, a thermally insulating material, a thermally conductive material, a passivation, a solder resist, or an adhesive or a combination thereof The first molding layer 216 can be directly on the peripheral lead 202 including a non-horizontal side of the peripheral lead 202. The first molding layer 216 can be between the peripheral lead 202 and another of the peripheral lead 202.

The first molding layer 216 can include a first molding layer top surface 218, which is defined as the horizontal surface of the first molding layer 216 on the side opposite the first integrated circuit 102. The first molding layer top surface 218 can be coplanar with the peripheral lead top surface 204. The first molding layer 216 can electrically isolate the peripheral lead 202 from another of the peripheral lead 202 or the peripheral lead 202 from the first integrated circuit 102.

The integrated circuit packaging system 100 can include the first integrated circuit 102. The first integrated circuit 102 can include an integrated circuit die, a flip chip, a wire-bond chip, a semiconductor die, a wafer-scale device, a multi-chip die, or a combination thereof.

The first integrated circuit 102 can be attached directly on a first adhesive 220, which is defined as a die attach or adhesive material. The first adhesive 220 can include a thermally conductive material, a thermally insulating material, an electrically conductive material, an electrically insulating material, or a combination thereof.

The first integrated circuit 102 can include a first die inactive side 224 and a first die active side 222 opposite the first die inactive side 224. The first die active side 222 is defined as the side of the first integrated circuit having active electronic components or elements for connections to the active circuitry within the first integrated circuit 102. The first adhesive 220 can be directly on the first die inactive side 224 of the first integrated circuit 102.

The first die active side 222 can include a first die pad 226, which is defined as an electrically conductive connector providing connectivity to the internal circuitry of the first integrated circuit 102. The first die active side 222 can be directly on the first interconnection layer 106. The first die active side 222 of the first integrated circuit 102 can be coplanar with the peripheral lead top surface 204, the first molding layer top surface 218 and the bottom surface of the first interconnection layer 106.

The first integrated circuit 102 can be between the peripheral lead 202 and another of the peripheral lead 202. The first integrated circuit 102 can be surrounded by a plurality of the peripheral lead 202. The peripheral lead 202 can surround a periphery of the first integrated circuit 102.

The first molding layer 216 can be between the first integrated circuit 102 and the peripheral lead 202. The first molding layer 216 can be directly on a non-horizontal side of the first integrated circuit 102 and the first adhesive 220.

The integrated circuit packaging system 100 can include a first interconnection layer 106 and a second interconnection layer 230, which are defined as structures that provide electrical connectivity between a semiconductor device, such as the first integrated circuit 102 or a second integrated circuit 250, and the peripheral lead 202. The first interconnection layer 106 and the second interconnection layer 230 can have similar structures. The first interconnection layer 106 is on the side opposite to the second interconnection layer 230. The first interconnection layer 106 can be electrically connected to the second interconnection layer 230 by the peripheral lead 202.

The first interconnection layer 106 can be directly on the first die active side 222. The first interconnection layer 106 can be directly on the peripheral lead 202 and the first molding layer 216.

The second interconnection layer 230 can be directly on a second die active side 256. The second interconnection layer 230 can be directly on the peripheral lead 202 and a second molding layer 240.

The first interconnection layer 106 can be a multi-layer structure that includes a variety of other layers and elements. The first interconnection layer 106 can include a first insulation layer 232, a second insulation layer 234, a first redistribution layer 236, and the first under bump metallization 104. The first interconnection layer 106 can include the second under bump metallization 105 over the first integrated circuit 102.

The first interconnection layer 106 can include a first insulation layer 232, which is defined as an electrically insulating protective layer that protects a portion of the bottom extent of the first redistribution layer 236. The first insulation layer 232 can include an insulation material including polyimide, a passivation material, a solder resist, an epoxy, an adhesive, or a combination thereof.

The first insulation layer 232 can be formed or applied directly on portions of the peripheral lead 202, the first molding layer 216, and the first integrated circuit 102. The first insulation layer 232 can be formed or applied directly on the peripheral lead top surface 204.

The first interconnection layer 106 can include the second insulation layer 234, which is defined as an electrically insulating protective layer. The second insulation layer 234 can be directly on and over the first insulation layer 232. The second insulation layer 234 can include an insulation material including polyimide, a passivation material, a solder resist, an epoxy, an adhesive, or a combination thereof. The second insulation layer 234 can be formed or applied directly on portions of the first insulation layer 232.

The first interconnection layer 106 can include a first redistribution layer 236, which is defined as a structure that provides electrical connectivity between a semiconductor device and the peripheral lead 202. The first redistribution layer 236 routes electrical connections or redistributes electrical signals from the first integrated circuit 102 to the peripheral lead 202.

The first redistribution layer 236 can include electrically conductive traces or connections that run between the first integrated circuit 102 and the peripheral lead 202. The first redistribution layer 236 can be formed over and directly on the first insulation layer 232. The first redistribution layer 236 can be formed over the peripheral lead 202. The first redistribution layer 236 can be formed directly on the peripheral lead 202. The second insulation layer 234 can be formed over and directly on the first redistribution layer 236. The first redistribution layer 236 can be formed over and directly on the first die pad 226 of the first integrated circuit 102. The first redistribution layer 236 can form an electrical connection from the first die pad 226 of the first integrated circuit 102 to the peripheral lead 202.

The first interconnection layer 106 can include the first under bump metallization 104, which is defined as an electrically conductive connector for providing a satisfactory surface for bonding to a further conductor or interconnect. The first under bump metallization 104 can be formed from a variety of materials including chromium (Cr), copper (Cu), titanium (Ti), nickel (Ni), vanadium (V), tungsten (W), gold (Au), or a combination thereof.

For example, the first under bump metallization 104 can provide an electrically conductive surface that is receptive to forming a solder connection. The first under bump metallization 104 can form an electrically conductive surface that is more receptive to forming a solder connection than aluminum or aluminum oxide. The first under bump metallization 104 can form an electrical connection with the first redistribution layer 236 and an external interconnection, such as a solder ball, solder bump, bond wire, or a combination thereof.

The first under bump metallization 104 can be formed over and directly in contact with the first redistribution layer 236. The first under bump metallization 104 can form an electrical connection with the peripheral lead 202 and the first die pad 226 of the first integrated circuit 102.

The first insulation layer 232 can include a first insulation bottom side 238. A plane of the first insulation bottom side 238 can be coplanar with the peripheral lead top surface 204, the first molding layer top surface 218, and the first die active side 222 of the first die.

It has been discovered that the first insulation layer 232 improves reliability by isolating the first redistribution layer 236 from another of the first redistribution layer 236 or the peripheral lead 202 from another of the peripheral lead 202 thereby eliminating solder creep or electrical shorts.

The integrated circuit packaging system 100 can include the first redistribution layer 236 formed with a number of layers. The first redistribution layer 236 can be formed with a redistribution layer conductive material, which is defined as an electrically conductive material including a metallic material or a metal alloy. For example, the distribution layer conductive material can include nickel (Ni), gold (Au), gold (Au) alloy, silver (Ag), palladium (Pd), nickel (Ni), a metal alloy, or a combination thereof.

For example, the first redistribution layer 236 can be formed with a plating process. As another example, the first redistribution layer 236 can include a structure of a build-up pre plated frame (PPF).

The integrated circuit packaging system 100 can include the second interconnection layer 230, which is defined as a structure that provides electrical connectivity between the second integrated circuit 250 and the peripheral lead 202. The second interconnection layer 230 can be directly on the second die active side 256. The second interconnection layer 230 can be directly on the peripheral lead pad 214 and the second molding layer 240. The second interconnection layer 230 can have a similar structure to the first interconnection layer 106.

The second interconnection layer 230 can be a multi-layer structure that includes a variety of other layers and elements. For example, the second interconnection layer 230 can include an inner insulation layer 270, an outer insulation layer 272, a second redistribution layer 274, and the first under bump metallization 104.

The second interconnection layer 230 can include the inner insulation layer 270, which is defined as an electrically insulating protective layer that protects a portion of the second redistribution layer 274. The inner insulation layer 270 can include an insulation material including a passivation material, a solder resist, an epoxy, an adhesive, or a combination thereof.

The inner insulation layer 270 can be formed or applied directly on portions of the peripheral lead 202, the second molding layer 240, and the second integrated circuit 250. The inner insulation layer 270 can be formed or applied directly on the peripheral lead pad 214.

The second interconnection layer 230 can include the outer insulation layer 272, which is defined as an electrically insulating protective layer. The outer insulation layer 272 can be directly on the inner insulation layer 270. The outer insulation layer 272 can include an insulation material including a passivation material, a solder resist, an epoxy, an adhesive, or a combination thereof. The outer insulation layer 272 can be formed or applied directly on portions of the inner insulation layer 270.

The second interconnection layer 230 can include the second redistribution layer 274, which is defined as a structure that provides electrical connectivity between a semiconductor device, the peripheral lead 202, and the first under bump metallization 104. The second redistribution layer 274 routes electrical connections or redistributes electrical signals from the second integrated circuit 250 to the peripheral lead 202 and the first under bump metallization 104.

The second redistribution layer 274 can include electrically conductive traces or connections that run between the second integrated circuit 250 and the peripheral lead 202. The second redistribution layer 274 can be formed directly on the inner insulation layer 270 and directly on the peripheral lead 202. The outer insulation layer 272 can be formed directly on a portion of the second redistribution layer 274. The second redistribution layer 274 can be formed directly on a second die pad 258 of the second integrated circuit 250.

It has been discovered that the present invention provides a means to channel signals from the top of the integrated circuit package to the bottom without the use of through vias. Connecting the first interconnection layer 106 to the second interconnection layer 230 via the peripheral lead 202 provides the ability to channels signals from the first integrated circuit 102 to the second integrated circuit 250.

The integrated circuit packaging system 100 can include the second molding layer 240, which is defined as a structure to cover a portion of the integrated circuit packaging system 100 providing mechanical, electrical, and environmental protection. The second molding layer 240 can include a liquid epoxy molding, an encapsulant material, a spin-coating, an electrically insulating material, a thermally insulating material, a thermally conductive material, a passivation, a solder resist, or an adhesive or a combination thereof.

The second molding layer 240 can be applied to the side of the integrated circuit packaging system 100 opposite to the first molding layer 216. The second molding layer 240 can be directly on the peripheral lead 202, the peripheral lead pad 214, and the first molding layer 216. The second molding layer 240 can be directly on the first adhesive 220 and a second adhesive 252. The first molding layer 216 can be directly on the first adhesive 220 and the second adhesive 252.

The inner surface of the second molding layer 240 can be coplanar with inner surface of the first molding layer 216. The inner surface of the second molding layer 240 can be coplanar with the first adhesive 220 and the second adhesive 252.

The inner surface of the first molding layer 216 can be coplanar with the first adhesive 220 and the second adhesive 252. The interface between the first adhesive 220 and the second adhesive 252 can be coplanar with the inner surface of the first molding layer 216 and the inner surface of the second molding layer 240.

The second molding layer 240 can be between the peripheral lead 202 and another of the peripheral lead 202. The second molding layer 240 can be between the peripheral lead pad 214 and another of the peripheral lead pad 214.

The second molding layer 240 can include a second molding layer outer surface 242. The second molding layer outer surface 242 can be coplanar with the peripheral lead top surface 204. The second molding layer outer surface 242 is on the side facing away from the first molding layer 216.

The second molding layer 240 can electrically isolate the peripheral lead 202 from another of the peripheral lead 202 or the peripheral lead 202 from the first integrated circuit 102. The second molding layer can electrically isolate the peripheral lead pad 214 from another of the peripheral lead pad 214.

It has been discovered that the peripheral lead 202 having the peripheral lead center ridge 212 covered by the first molding layer 216 and the second molding layer 240 improves interlocking of the peripheral lead 202 with the integrated circuit packaging system 100 and reduces lead pullouts.

The integrated circuit packaging system 100 can include the second integrated circuit 250. The second integrated circuit 250 can include an integrated circuit, a flip chip, a wire-bond chip, a semiconductor die, a wafer-scale device, a multi-chip die, or a combination thereof.

The second integrated circuit 250 can include the second adhesive 252, which is defined as a die attach or adhesive material. The second adhesive 252 can include a thermally conductive material, a thermally insulating material, an electrically conductive material, an electrically insulating material, or a combination thereof.

The second integrated circuit 250 can include a second die inactive side 254 and the second die active side 256 opposite the second die first die inactive side 224. The second adhesive 252 can be directly on the first die inactive side 224 of the second integrated circuit 250. The second adhesive 252 can be directly on the first adhesive 220.

The second die active side 256 of the second integrated circuit 250 can include the second die pad 258, which is defined as an electrically conductive connector providing connectivity to the internal circuitry of the second integrated circuit 250. The second die active side 256 can be directly on the first interconnection layer 106. The second die active side 256 of the second integrated circuit 250 can be coplanar with the outer side of the peripheral lead pad 214, and the bottom surface of the first interconnection layer 106.

The second integrated circuit 250 can be between the peripheral lead 202 and another of the peripheral lead 202. The second integrated circuit 250 can be surrounded by a plurality of the peripheral lead 202. The peripheral lead 202 can surround a periphery of the second integrated circuit 250.

The first molding layer 216 can be between the second integrated circuit 250 and the peripheral lead 202. The first molding layer 216 can be directly on a non-horizontal side of the second integrated circuit 250 and the second adhesive 252.

The integrated circuit packaging system 100 can include an external connector 260, which is defined as an electrically conductive connector connected or attached to the first under bump metallization 104 and the external system. The integrated circuit packaging system 100 can include a plurality of the external connector 260.

For example, the external connector 260 can represent an electrical connector including a conductive ball, a solder ball, a solder bump, a bond wire, a connection tab, or a combination thereof. Also for example, the external connector 260 can be formed with an electrically conductive material including solder, a metal, a metallic alloy, or a combination thereof. For a specific example, the external connector 260 can represent a solder ball for enhancing board level reliability (BLR) performance.

The first under bump metallization 104 can include a recess 264 in the center of the first under bump metallization 104 directly above the center of the peripheral lead 202. The external connector 260 can be attached to the first under bump metallization 104 and extend within the recess 264.

For example, the first under bump metallization 104 can include the recess 264 can be connected to the external connector 260, such that solder ball and printing method is adaptable for providing a locking enhancement between the first under bump metallization 104 and the external connector 260 providing an improved board level reliability improvement.

For illustrative purposes, the first under bump metallization 104 is shown with the recess 264, although it is understood that the first under bump metallization 104 can be formed without the recess 264. In a further example, the first redistribution layer 236 is shown with a structure to accommodate the recess 264 of the first under bump metallization 104. However, it is understood that the first redistribution layer 236 can be formed without accommodating the recess 264 of the first under bump metallization 104.

The integrated circuit packaging system 100 can be configured to provide a variety of electrical connection and interconnections between the first integrated circuit 102, the second integrated circuit 250, and the external connector 260. For example, a wafer level package can be reconfigured to provide an electrical connection between the first integrated circuit 102 and the second integrated circuit 250. The integrated circuit packaging system 100 can provide an electrical connection from the first die pad 226 of the first integrated circuit 102 to the second die pad 258 of the second integrated circuit 250 via the first interconnection layer 106, the first redistribution layer 236, the peripheral lead 202, the peripheral lead pad 214, the second interconnection layer 230, and the second redistribution layer 274.

In another example, the integrated circuit packaging system 100 can provide an electrical connection from the first die pad 226 of the first integrated circuit 102 to the external connector 260. The electrical connection can include the first interconnection layer 106, the peripheral lead 202, the first under bump metallization 104, and the external connector 260.

In yet another example, the integrated circuit packaging system 100 can provide an electrical connection from the second die pad 258 of the second integrated circuit 250 to the external connector 260. The electrical connection can include the second die pad 258, the second redistribution layer 274, the first under bump metallization 104, and the external connector 260.

It has been discovered that the present invention provides wire span reduction as well as package size reduction by having the first redistribution layer 236 connected to the first under bump metallization 104, the peripheral lead 202, and the first integrated circuit 102. The reduction in package size and wire span can provide reduced costs, higher reliability, and elimination of complex bond layout.

It has been discovered that the first under bump metallization 104 having the recess 264 provides a reliable connection site to attach the external connector 260 to the peripheral lead 202, thereby resulting in greater board level reliability (BLR) performance improvement with the "ball catch" structure compared to a non-ball catch or planar structure.

Figure 3:
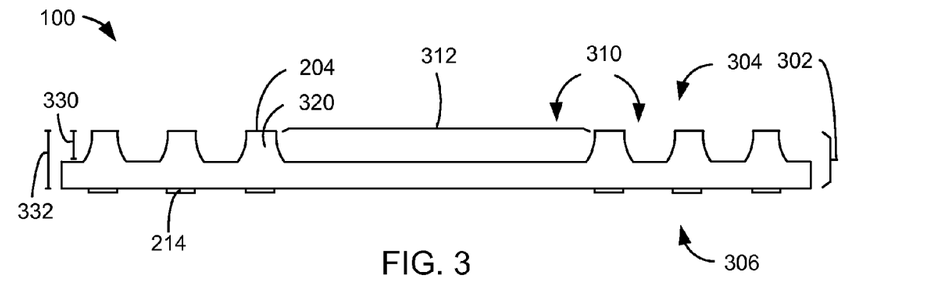
FIG. 3 is the integrated circuit packaging system in a first removal phase of manufacture.

Referring now to FIG. 3, therein is shown the integrated circuit packaging system in a first removal phase of manufacture. The integrated circuit packaging system 100 can include a leadframe 302, which is defined as a structure for mounting and connecting a semiconductor device thereto. The leadframe 302 can be formed with an electrically conductive material including copper, aluminum, other metals, metal alloys, or a combination thereof.

The integrated circuit packaging system 100 can include a first removal method to form a partially removed region 310, which is defined as a region of the leadframe 302 where some material has been removed. The first removal method can include removing material from the leadframe 302 to form the partially removed region 310. The first removal method can include etching, grinding, cutting, ablation, or a combination thereof. For example, the partially removed region 310 can have the characteristics of an etched surface.

The leadframe 302 can include a leadframe first side 304 and a leadframe second side 306 opposite the leadframe first side 304. A portion of the leadframe 302 at the leadframe first side 304 can be removed in a controlled manner to form the partially removed region 310.

For example, the partially removed region 310 can be formed with the leadframe 302 half-etched. The partially removed region 310 can have a depth equal to half of the height of the leadframe 302. In another example, the leadframe can have a leadframe thickness 332 of 250 micrometers (μm). The partially removed region 310 can have a partially removed region depth 330 of 125 micrometers. The partially removed region 310 can be half the thickness of the leadframe 302.

For example, the leadframe 302 can be provided with a structure pre-etched at the leadframe first side 304. As another example, the leadframe 302 can be provided with a structure that is not pre-etched and will be etched in a subsequent phase.

The partially removed region 310 can include a partially removed interior region 312. The partially removed interior region 312 is formed to be larger than the first integrated circuit 102. The partially removed interior region 312 has the same depth as the partially removed region 310. For example, the partially removed interior region 312 can have a depth of 125 micrometers.

The integrated circuit packaging system 100 can include a peripheral lead upper portion 320, which is defined as an un-etched structure surrounded horizontally by a portion of the partially removed region 310. The integrated circuit packaging system 100 can include a plurality of the peripheral lead upper portion 320. The peripheral lead upper portion 320 can be on the leadframe first side 304. The peripheral lead upper portion 320 can have a vertical dimension equal to the depth of the partially removed region 310.

The peripheral lead upper portion 320 can include the peripheral lead top surface 204. The peripheral lead top surface 204 can be coplanar with another of the peripheral lead top surface 204.

The integrated circuit packaging system 100 can include the peripheral lead pad 214, which is defined as a conductive structure formed on the leadframe 302 to protect the underlying leadframe material. The peripheral lead pad 214 is formed directly on the leadframe second side 306. The peripheral lead pad 214 can be formed with a number of layers. The peripheral lead pad 214 can be formed with a lead plate conductive material, which is defined as an electrically conductive material including a metallic material, a metal alloy, or a combination thereof.

For example, the lead plate conductive material can include nickel (Ni), palladium (Pd), gold (Au), a metal alloy, or a combination thereof. In another example, the lead plate conductive material can include nickel-palladium (NiPd) or nickel-palladium-gold (NiPdAu).

The integrated circuit packaging system 100 can include a high aspect ratio etching process for the leadframe 302, including where the leadframe 302 is composed of copper, another metal, a metal alloy, or a combination thereof. For example, deep aspect ratio etching for a Quad Flat-pack Nolead package with stand-off terminals and multi-row (QFN-st-mr) can include a 127 um frame thickness and 90 um etch depth when using a sub 3 mil die thicknesses. In another example, a high aspect ratio copper etch with a good applicability is a 200 um frame thickness with a 150 um etch depth, which would support the use of a 5 mil thick dice (+1 mil BLT).

The leadframe 302 can be etched in a variety of methods with a variety of tolerances. In a specific example, the etching registration tolerance can be made to be +/−0.005 mm.

In yet another example, the peripheral lead pad 214 can be formed with a plating process. In a further example, the peripheral lead pad 214 can include a structure of a build-up pre-plated frame (PPF).

It has been discovered that the present invention provides improved lead stability. Etching the leadframe 302 to form the peripheral lead upper portion 320 results in the peripheral lead center ridge 212 that is wider than the peripheral lead upper portion 320. The wider base of the peripheral lead upper portion 320 can make the structure more stable.

Figure 4:
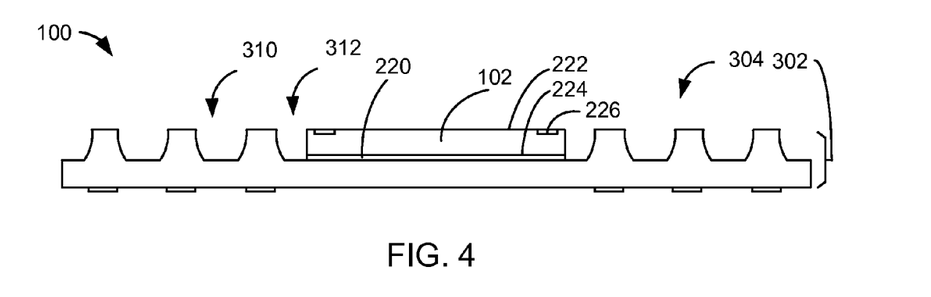
FIG. 4 is the structure of FIG. 3 in a first die attach phase of manufacture.

Referring now to FIG. 4, therein is shown the structure of FIG. 3 in a first die attach phase of manufacture. The integrated circuit packaging system 100 can include a first die attach method to mount the first integrated circuit 102 over the leadframe 302. The first integrated circuit 102 can include the first die inactive side 224 facing the leadframe first side 304. The first integrated circuit 102 can be attached to the leadframe first side 304 with the first adhesive 220.

The integrated circuit packaging system 100 can include the first integrated circuit 102 mounted over the leadframe 302. The first integrated circuit 102 can be mounted in the partially removed interior region 312 of the leadframe 302. For example, the first integrated circuit 102 can be mounted in a centered position within the partially removed interior region 312.

The first integrated circuit 102 can be attached to the leadframe 302 with the first adhesive 220. The first adhesive 220 can be directly on the first die inactive side 224 of the first integrated circuit 102. The first adhesive 220 can be directly on the leadframe 302.

The first integrated circuit 102 can include the first die pad 226 exposed on the first die active side 222 of the first integrated circuit 102. The first die pad 226 can include a top surface coplanar with the first die active side 222.

The first integrated circuit 102 can be mounted and attached to the leadframe 302 in a variety of methods. For example, the placement tolerance of the first integrated circuit 102 on the leadframe 302 can be the same as provided by the Extended Wafer Level BGA (eWLB) die attach bonder, as the same technology can be employed while using wafer backside lamination or b-stage coating as the adhesive of choice.

This can avoid further movement of the first integrated circuit 102 during placement and result in similar performance as in the eWLB die attach process.

It has been discovered that the present invention provides more accurate vertical positioning of the first integrated circuit 102 by etching the partially removed region 310 to a specific depth that matches the height of the first integrated circuit 102 and the first adhesive 220.

Figure 5:
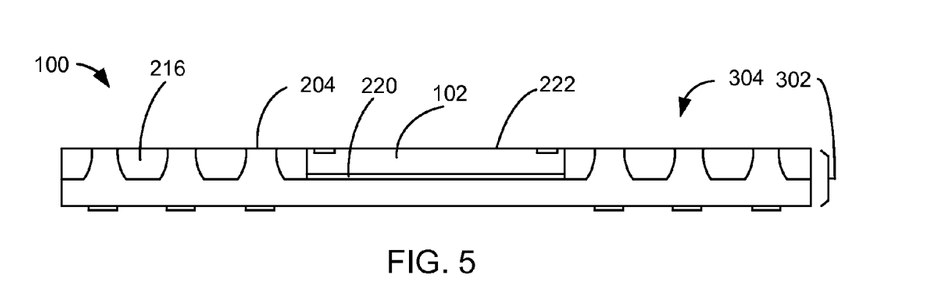
FIG. 5 is the structure of FIG. 4 in a first molding phase of manufacture.

Referring now to FIG. 5, therein is shown the structure of FIG. 4 in a first molding phase of manufacture. The integrated circuit packaging system 100 can include a first molding layer 216 over the leadframe 302.

The integrated circuit packaging system 100 can include a first molding method to form the first molding layer 216 over the leadframe first side 304 of the leadframe 302. The first molding method can include forming the first molding layer 216 with a top surface of the first molding layer 216 coplanar with the peripheral lead top surface 204 and the first die active side 222 of the first integrated circuit 102. The first molding method can include removing material from the first molding layer 216 to make the first molding layer 216 coplanar with the peripheral lead top surface 204 and the first die active side 222 of the first integrated circuit 102.

The first molding layer 216 can be formed over the leadframe 302 and in the partially removed region 310 of FIG. 3 including the partially removed interior region 312 of FIG. 3. The first molding layer 216 can be directly on the leadframe 302, the peripheral lead upper portion 320 of FIG. 3, and the first integrated circuit 102. The first molding layer 216 can be between the peripheral lead 202 of FIG. 2 and another of the peripheral lead 202. The first molding layer 216 can be between the peripheral lead 202 and the first integrated circuit 102.

The first molding layer 216 can expose the first die active side 222 of the first integrated circuit 102. The first molding layer 216 can be directly on the non-horizontal sides of the first integrated circuit 102. The first molding layer 216 can be directly on the first adhesive 220.

The first molding layer 216 can have the same depth as the depth of the partially removed region 310 of the leadframe 302. For example, the first molding layer 216 can have a depth of 125 micrometers.

Figure 6:
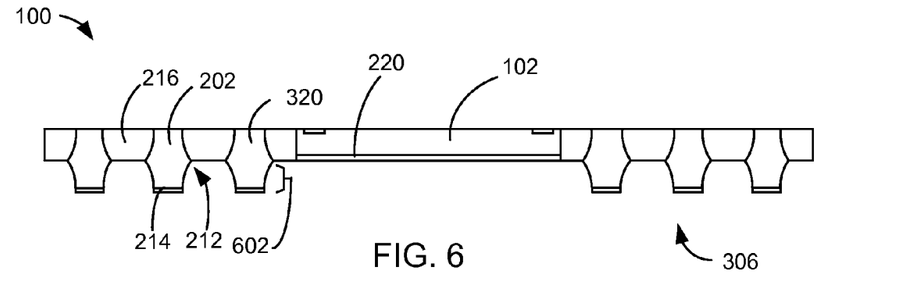
FIG. 6 is the structure of FIG. 5 in a second removal phase of manufacture.

Referring now to FIG. 6, therein is shown the structure of FIG. 5 in a second removal phase of manufacture. The second removal phase can include removal of a portion of the leadframe second side 306 unprotected by the peripheral lead pad 214 to form the peripheral lead 202.

The integrated circuit packaging system 100 can include a second removal method to form a peripheral lead lower portion 602 on the leadframe second side 306 of the leadframe 302. The second removal method can include removing material from the leadframe 302 to form the peripheral lead lower portion 602. The second removal method can include copper etching, photolithographic etching, grinding, cutting, ablation, or a combination thereof.

The second removal method can include removing material from the leadframe 302 of FIG. 3 in a location on the opposite side from the partially removed region 310 of FIG. 3. The second removal method can include removing material from the leadframe 302 to expose the bottom surface of the first molding layer 216. The second removal method can include removing material from the leadframe 302 to expose the bottom of the first adhesive 220.

The second removal method can include removing material from the leadframe 302 forming a concave opening in the leadframe 302 and exposing the first molding layer 216. The peripheral lead lower portion 602 can be formed with the peripheral lead center ridge 212 at the side away from the peripheral lead pad 214.

It has been discovered that the present invention provides the integrated circuit packaging system 100 with an improved channel for forming an electrical connection from the top of the system to the bottom of the system. Removing material from the leadframe 302 while the peripheral lead upper portion 320 of FIG. 3 is attached to the first molding layer 216 allows the formation of the peripheral lead 202, which can be used to transfer electrical signals from the top side of the integrated circuit packaging system 100 to the bottom side.

It has also been discovered that the present invention provides a simplified method of forming the peripheral lead 202 and the peripheral lead lower portion 602 by attaching the peripheral lead pad 214 to the leadframe 302 and removing material from the leadframe 302 that is not protected by the peripheral lead pad 214. By positioning the peripheral lead pad 214 in alignment with the peripheral lead upper portion 320, the peripheral lead 202 can be formed in a single additional operation, reducing complexity and manufacturing cost.

It has also been yet discovered that the present invention provides reduced package size by removing material from the leadframe 302 to expose the first adhesive 220 of the first integrated circuit 102, where the first integrated circuit 102 is attached to the first molding layer 216. Exposing the first adhesive 220 of the first integrated circuit 102 can allow mounting of the second integrated circuit 250 of FIG. 2 without any additional support structure, thus reducing the overall package height.

Figure 7:
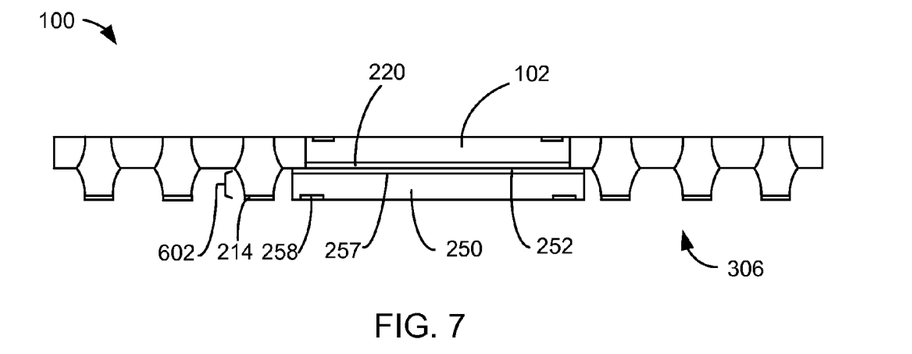
FIG. 7 is the structure of FIG. 6 in a second die attach phase of manufacture.

Referring now to FIG. 7, therein is shown the structure of FIG. 6 in a second die attach phase of manufacture. The integrated circuit packaging system 100 can include a second die attach method to mount the second integrated circuit 250 over the leadframe 302 of FIG. 3. The second integrated circuit 250 can include the second die inactive side 257 of the second integrated circuit 250 facing the first integrated circuit 102. The second integrated circuit 250 can be attached to the first integrated circuit 102 with the second adhesive 252.

The integrated circuit packaging system 100 can include the second integrated circuit 250 mounted on the leadframe 302. The second integrated circuit 250 can be on the first adhesive 220. The second adhesive 252 can be in direct contract with the first adhesive 220.

The integrated circuit packaging system 100 can include the second integrated circuit 250 mounted between the peripheral lead lower portion 602 and another of the peripheral lead lower portion 602. The second integrated circuit 250 can be mounted directly under the first integrated circuit 102.

The second integrated circuit 250 can include the second die pad 258 exposed on the second die active side 256 of the second integrated circuit 250. The second die pad 258 can include a bottom surface coplanar with the second die active side 256 of the second integrated circuit 250. The second die pad 258 can include the bottom surface coplanar with the bottom surface of the peripheral lead pad 214.

The integrated circuit packaging system 100 can provide a variety of device integration configurations. For example, the integrated circuit packaging system 100 can include integrating multiple semiconductor devices, including the first integrated circuit 102 and the second integrated circuit 250, in a wafer level reconfigured package. Thus, the integrated circuit packaging system 100 can include dual dies. Although the integrated circuit packaging system 100 can include the first integrated circuit 102 and the second integrated circuit 250, it is understood that the system can also include just the first integrated circuit 102.

In another example, the first integrated circuit 102 and the second integrated circuit 250 can be the same type of semiconductor device. However, it is understood that the first integrated circuit 102 and the second integrated circuit 250 can be different types of semiconductor devices. In addition, the first integrated circuit 102 and the second integrated circuit 250 can have the same or different physical dimensions.

It has been discovered that the present invention provides the integrated circuit packaging system 100 with improved package density by mounting the second integrated circuit 250 on the first integrated circuit 102. By mounting the second adhesive 252 of the second integrated circuit 250 directly on the first adhesive 220 of the first integrated circuit 102 with no intervening layers or material, the package height can be reduced and package density increased.

It has also been discovered that the present invention provides an improved stable platform for mounting the second integrated circuit 250 on the first integrated circuit 102. By removing a portion of the leadframe 302 to expose the first adhesive 220 of the first integrated circuit 102, where the first integrated circuit 102 is attached to the leadframe 302 by the first molding layer 216, the integrated circuit packaging system 100 provides an improved stable platform for mounting the second integrated circuit 250.

Figure 8:
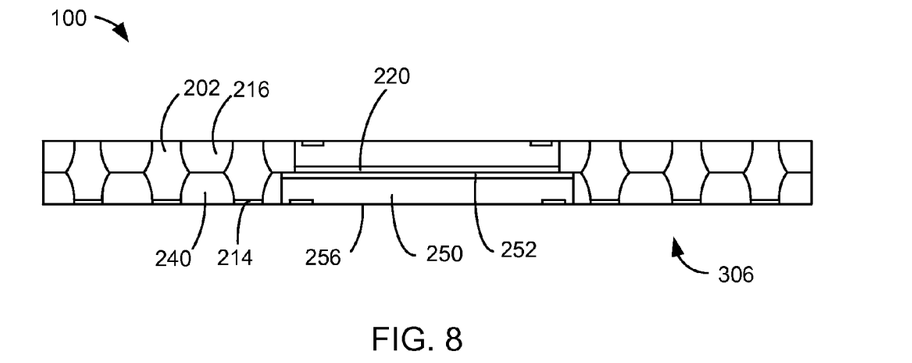
FIG. 8 is the structure of FIG. 7 in a second molding phase of manufacture.

Referring now to FIG. 8, therein is shown the structure of FIG. 7 in a second molding phase of manufacture. The integrated circuit packaging system 100 can include the second molding layer 240 below the first molding layer 216.

The integrated circuit packaging system 100 can include a second molding method to form the second molding layer 240 on the leadframe second side 306 of the leadframe 302 of FIG. 3 in direct contract with the first molding layer 216. The second molding method can include forming the second molding layer 240 with an outer surface of the second molding layer 240 coplanar with the bottom surface of the peripheral lead pad 214 and the second die active side 256 of the second integrated circuit 250. For example, the second molding method can include removing material from the second molding layer 240 to make the second molding layer 240 coplanar with the bottom surface of the peripheral lead pad 214 and the second die active side 256 of the second integrated circuit 250.

The second molding layer 240 can be formed between the plane of the bottom surface of the peripheral lead pad 214 and the first molding layer 216. The second molding layer 240 can be directly on the first molding layer 216, the peripheral lead lower portion 602 of FIG. 6, the peripheral lead pad 214, the second integrated circuit 250, the second adhesive 252 and the first adhesive 220. The second molding layer 240 can be between the peripheral lead 202 and another of the peripheral lead 202. The second molding layer 240 can be between the peripheral lead 202 and the second integrated circuit 250.

The second molding layer 240 can expose the second die active side 256 of the second integrated circuit 250. The second molding layer 240 can be directly on the non-horizontal sides of the second integrated circuit 250. The second molding layer 240 can be directly on the second adhesive 252. The second molding layer 240 can be directly on the first adhesive 220.

The second molding layer 240 can have the same depth as the depth of the partially removed region 310 of FIG. 3 of the leadframe 302 of FIG. 3. For example, the second molding layer 240 can have a depth of 125 micrometers. However, it is understood that the second molding layer 240 can have a different depth than the first molding layer 216 and a different depth than the partially removed region 310.

It has been discovered that the present invention provides an improved interlock mechanism to prevent the pullout or motion of the peripheral lead 202 by forming the second molding layer 240 directly on the first molding layer 216. The peripheral lead center ridge 212 of FIG. 2 extends horizontally from the center of the peripheral lead 202 forming an interlock mechanism between the first molding layer 216 and the second molding layer 240. Further, the first molding layer 216 and the second molding layer 240 can form a mechanical seal along the interface between the two layers to further resist motion of the peripheral lead 202 in the vertical direction.

Figure 9:
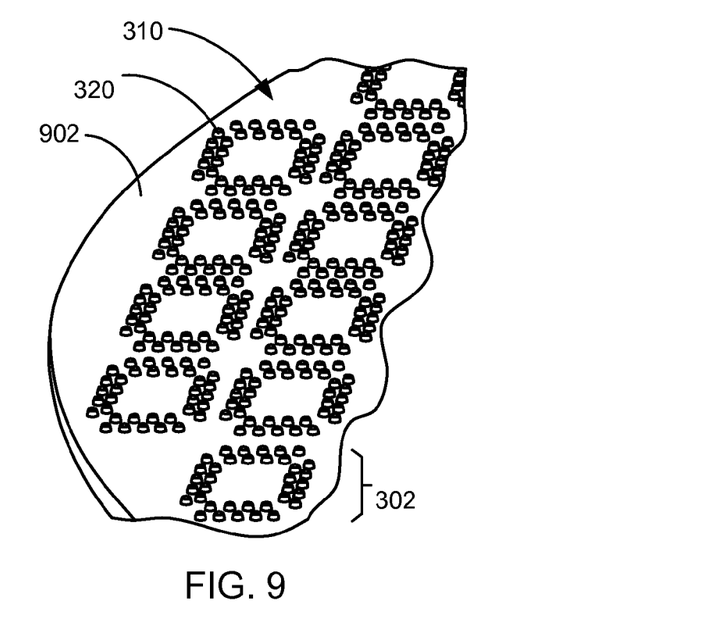
FIG. 9 is an example of an etched carrier.

Referring now to FIG. 9, therein is shown an example of an etched carrier 902. The etched carrier 902 can include the leadframe 302 with the partially removed region 310 and the peripheral lead upper portion 320. The etched carrier 902 can include a plurality of the leadframe 302.

It has been discovered that the present invention can reduce the cost of production by forming multiple instances of the partially removed region 310 of FIG. 3 by removing material from the etched carrier to form a plurality of the leadframe 302. The plurality of the leadframe 302 can be singulated after the formation of the integrated circuit packaging system 100.

Figure 10:
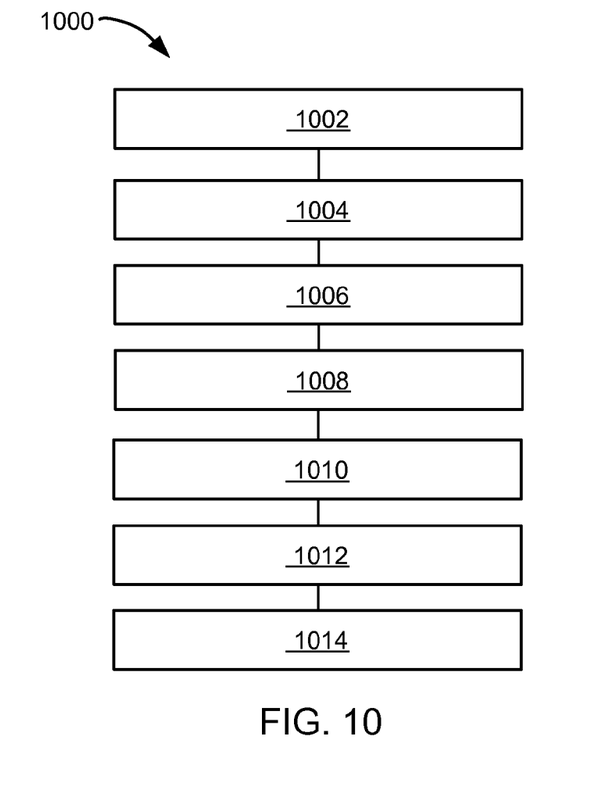
FIG. 10 is a flow chart of a method of manufacture of an integrated circuit packaging system in a further embodiment of the present invention.

Referring now to FIG. 10, therein is shown a flow chart of a method 1000 of manufacture of an integrated circuit packaging system in a further embodiment of the present invention. The method 1000 includes: removing a portion of a leadframe to form a partially removed region and an upper portion of a peripheral lead on the leadframe first side (304) in a block 1002; mounting a first integrated circuit over the partially removed region with a first adhesive in a block 1004; forming a first molding layer directly on the first integrated circuit and the peripheral lead in a block 1006; removing a portion of a leadframe second side exposing the first adhesive in a block 1008; mounting a second integrated circuit on the first adhesive of the first integrated circuit in a block 1010; forming a first interconnection layer directly on the first integrated circuit with the first integrated circuit and the peripheral lead electrically connected in a block 1012; and forming a second interconnection layer directly on the second integrated circuit with the second integrated circuit and the peripheral lead electrically connected in a block 1014.

Thus, it has been discovered that the integrated circuit packaging system of the present invention furnishes important and heretofore unknown and unavailable solutions, capabilities, and functional aspects for an integrated circuit packaging system with connection. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
removing a portion of a leadframe first side to form a partially removed region and a peripheral lead upper portion;
mounting a first integrated circuit over the partially removed region with a first adhesive;
forming a first molding layer directly on the first integrated circuit and the peripheral lead upper portion with a first molding layer top surface coplanar with a peripheral lead top surface and a first die active side;
removing a portion of a leadframe second side exposing the first adhesive and the first molding layer to form a peripheral lead lower portion having a peripheral lead center ridge of the peripheral lead lower portion wider than a peripheral lead upper portion;
mounting a second integrated circuit over the first adhesive and the first integrated circuit;
forming a second molding layer directly on the second integrated circuit and the first molding layer, wherein the second molding layer is on and between the peripheral lower portion and another peripheral lower portion, the peripheral lead upper portion and the peripheral lead lower portion form a single structure of a peripheral lead having the peripheral lead center ridge, and a second molding layer outer surface of the second molding layer coplanar with a second die active side of the second integrated circuit;
forming a first interconnection layer directly on the first integrated circuit with the first integrated circuit and the peripheral lead electrically connected, the first interconnection layer has a first under bump metallization and a second under bump metallization, the second under bump metallization is directly over the first integrated circuit; and
forming a second interconnection layer directly on the second integrated circuit with the second integrated circuit and the peripheral lead electrically connected.

2. The method as claimed in claim 1 wherein forming the second molding layer directly on the second integrated circuit includes having a second molding layer outer surface coplanar with a second die active side of the second integrated circuit.

3. The method as claimed in claim 1 wherein forming the peripheral lead includes forming the peripheral lead having a peripheral lead pad on a peripheral lead bottom surface.

4. The method as claimed in claim 1 wherein:
forming the first interconnection layer includes forming a first redistribution layer; and
forming the first interconnection layer includes having the first under bump metallization on the first redistribution layer.

5. The method as claimed in claim 1 wherein mounting the second integrated circuit on the first adhesive includes attaching a second adhesive directly on the second integrated circuit and the first adhesive.

6. A method of manufacture of an integrated circuit packaging system comprising:
removing a portion of a leadframe first side to form a partially removed region and a peripheral lead upper portion on the leadframe first side, the peripheral lead upper portion has a peripheral lead top surface;
mounting a first integrated circuit over the partially removed region with a first adhesive;
forming a first molding layer directly on the first integrated circuit and the peripheral lead upper portion with a first molding layer top surface coplanar with a peripheral lead top surface and a first die active side;
removing a portion of a leadframe second side exposing the first adhesive and the first molding layer to form a peripheral lead lower portion having a peripheral lead center ridge of the peripheral lead lower portion wider than a peripheral lead upper portion on the leadframe second side, the peripheral lead lower portion has a peripheral lead pad;
mounting a second integrated circuit over the first adhesive and the first integrated circuit;
forming a second molding layer directly on the second integrated circuit and the peripheral lead lower portion, wherein the second molding layer is on and between the peripheral lead pad and another peripheral lead pad, the peripheral lead upper portion and the peripheral lead lower portion form a single structure of a peripheral lead having the peripheral lead center ridge, and a second molding layer outer surface of the second molding layer coplanar with a second die active side of the second integrated circuit ridge;
forming a first interconnection layer directly on the first integrated circuit with the first integrated circuit and the peripheral lead electrically connected, the first interconnection layer has a first under bump metallization and a second under bump metallization, the second under bump metallization is directly over the first integrated circuit; and
forming a second interconnection layer directly on the second integrated circuit with the second integrated circuit and the peripheral lead electrically connected.

7. The method as claimed in claim 6 further comprising:
attaching a second adhesive directly on the second integrated circuit; and
wherein:
forming the first molding layer includes having an inner surface of the first molding layer coplanar with an interface between the first adhesive and the second adhesive;
forming the first interconnection layer includes forming a first redistribution layer; and
forming the first under bump metallization includes forming the first under bump metallization directly on the first redistribution layer.

8. The method as claimed in claim 6 wherein:
forming the first interconnection layer includes forming a first redistribution layer;
forming the first under bump metallization includes forming the first under bump metallization directly on the first redistribution layer; and
forming the second under bump metallization includes forming the second under bump metallization having a recess directly on the first redistribution layer.

9. The method as claimed in claim 6 wherein forming the first under bump metallization directly on the first interconnection layer includes having an electrical connection to a first die pad of the first integrated circuit.

10. The method as claimed in claim 6 wherein:
forming the first interconnection layer includes forming a first redistribution layer;
forming the first under bump metallization includes forming the first under bump metallization directly on the first redistribution layer;

forming the second under bump metallization includes forming the second under bump metallization having a second width; and forming the first under bump metallization having a first width larger than the second width.

11. An integrated circuit packaging system comprising:
a peripheral lead, the peripheral lead is a single structure with a peripheral lead upper portion and a peripheral lead lower portion having a peripheral lead top surface, a peripheral lead center ridge, and a peripheral lead pad, and the peripheral lead center ridge is wider than a peripheral lead upper portion;
a first interconnection layer directly on the peripheral lead top surface, the first interconnection layer has a first under bump metallization and a second under bump metallization;
a first integrated circuit directly on the first interconnection layer, the second under bump metallization is directly over the first integrated circuit;
a second integrated circuit on the first integrated circuit;
a first adhesive between the first integrated circuit and the second integrated circuit;
a first molding layer directly on the peripheral lead and the first integrated circuit, a first molding layer top surface is coplanar with the peripheral lead top surface and a first die active side of the first integrated circuit;
a second molding layer directly on the second integrated circuit and the first molding layer, wherein the second molding layer is on and between the peripheral lead pad and another peripheral lead pad and a second molding layer outer surface of the second molding layer is coplanar with a second die active side of the second integrated circuit; and
a second interconnection layer directly on the second integrated circuit.

12. The system as claimed in claim 11 wherein the second molding layer is directly on the first molding layer, and the second molding layer is coplanar with the second integrated circuit.

13. The system as claimed in claim 11 wherein the peripheral lead pad forms a peripheral lead bottom surface.

14. The system as claimed in claim 11 wherein:
the first interconnection layer has a first redistribution layer;
the first under bump metallization is directly on the first redistribution layer; and
the first integrated circuit is electrically connected to the first redistribution layer, the first under bump metallization and the peripheral lead.

15. The system as claimed in claim 11 further comprising a second adhesive directly on the second integrated circuit and the first adhesive.

16. The system as claimed in claim 11 wherein the second molding layer is directly on the peripheral lead center ridge.

17. The system as claimed in claim 16 further comprising:
a second adhesive directly on the second integrated circuit; and
wherein:
the first molding layer includes an inner surface of the first molding layer coplanar with an interface between the first adhesive and the second adhesive.

18. The system as claimed in claim 16 wherein:
the first interconnection layer has a first redistribution layer;
the first under bump metallization is directly on the first redistribution layer;
the second under bump metallization is directly on the first redistribution layer; and
the second under bump metallization has a recess.

19. The system as claimed in claim 16 wherein:
the first under bump metallization is directly on the first interconnection layer; and
the first under bump metallization is electrically connected to a first die pad of the peripheral lead.

20. The system as claimed in claim 16 wherein:
the first interconnection layer has a first redistribution layer;
the first under bump metallization is directly on the first redistribution layer;
the second under bump metallization has a second width; and
the first under bump metallization has a first width larger than the second width.

* * * * *